(12) United States Patent
Ohtomo (10) Patent No.: US 8,786,253 B2
(45) Date of Patent: Jul. 22, 2014

(54) ELECTRIC CHARGING SYSTEM AND ELECTRIC CHARGER

(71) Applicant: Fuji Jukogyo Kabushiki Kaisha, Tokyo (JP)

(72) Inventor: Yosuke Ohtomo, Tokyo (JP)

(73) Assignee: Fuji Jukogyo Kabushiki Kaisha, Tokyo (JP)

( * ) Notice: Subject to any disclaimer, the term of this patent is extended or adjusted under 35 U.S.C. 154(b) by 67 days.

(21) Appl. No.: 13/670,349

(22) Filed: Nov. 6, 2012

(65) Prior Publication Data

US 2013/0127415 A1 May 23, 2013

(30) Foreign Application Priority Data

Nov. 18, 2011 (JP) ................................. 2011-252775

(51) Int. Cl.
*H02J 7/00* (2006.01)
*H02J 7/14* (2006.01)

(52) U.S. Cl.
USPC ............................ 320/109; 320/104; 320/132

(58) Field of Classification Search
CPC ..................................................... H02J 7/0027
USPC ............................................................ 320/109
See application file for complete search history.

(56) References Cited

FOREIGN PATENT DOCUMENTS

JP 2009-083670 A 4/2009

*Primary Examiner* — Edward Tso
*Assistant Examiner* — Ahmed Omar
(74) *Attorney, Agent, or Firm* — McGinn IP Law Group, PLLC

(57) ABSTRACT

There is provided an electric charging system in which an electric charger and an electric vehicle are connected by a charging cable. The electric charger calculates a voltage drop amount in the charging cable on the basis of a supplied current at the electric charger side and an electric resistance of the charging cable. The electric charger also compares a determination voltage with a supplied voltage at the electric charger side and determines that a battery has been charged to a fully charged state when the supplied voltage reaches the determination voltage. The determination voltage used for such full charge determination is updated by adding the voltage drop amount to a basic determination voltage that is set in advance.

16 Claims, 10 Drawing Sheets

ELECTRIC CHARGING SYSTEM AND ELECTRIC CHARGER

CROSS REFERENCES TO RELATED APPLICATIONS

The present application claims priority from Japanese Patent Application No. 2011-252775, filed on Nov. 18, 2011, the entire contents of which are hereby incorporated by reference.

BACKGROUND OF THE INVENTION

1. Field of the Invention

The present invention relates to an electric charging system and an electric charger, and, in particular, to a technology for preventing the erroneous determination of the state of charge of an electric storage device charged with an electric charger.

2. Description of the Related Art

In recent years, electric vehicles that are equipped with an electric motor for propulsion have been under development. When an electric storage device such as a battery that is installed at the electric vehicle is charged, a charging cable extending from an electric charger is connected to a charging port of the electric vehicle (see, for example, Japanese Unexamined Patent Application Publication No. 2009-83670). Furthermore, in the field of hybrid electric vehicles that are equipped with an engine and an electric motor for propulsion, a hybrid electric vehicle of the so-called plug-in system, in which an electric storage device can be charged with an electric charger, is under development.

However, since the charging cable has an electric resistance and an impedance, a voltage drop occurs in the charging cable during charging. Thus, since a difference occurs between a supplied voltage the electric charger side and a received voltage at the electric vehicle, charging of the electric storage device is difficult to determine with high accuracy on the basis of the supplied voltage at the electric charger side. As a result, the state of charge of the electric storage device cannot be accurately confirmed with the electric charger, and appropriate charging control is difficult to perform with the electric charger.

SUMMARY OF THE INVENTION

It is an object of the present invention to prevent the erroneous determination of the state of charge of an electric storage device charged with an electric charger.

An aspect of the present invention provides an electric charging system in which an electric charger and an electric vehicle are connected by a charging cable, and an electric storage device installed on the electric vehicle is charged, the electric charging system including: a first reference setting unit that sets a reference point for supplied voltage data calculated by subjecting a supplied voltage at the electric charger side to predetermined filter processing, the reference point being set on the basis of a variation rate of the supplied voltage data; a second reference setting unit that sets a reference point for received voltage data calculated by subjecting a received voltage at the electric vehicle side to predetermined filter processing, the reference point being set on the basis of a variation rate of the received voltage data; a data synchronization unit that synchronizes the supplied voltage data and the received voltage data on the basis of the reference points of the supplied voltage data and the received voltage data; a voltage difference calculation unit that compares the synchronized supplied voltage data and received voltage data and calculates a voltage difference between the supplied voltage and the received voltage; a resistance calculation unit that calculates a power supply resistance of the charging cable on the basis of the voltage difference between the supplied voltage and the received voltage; a drop amount calculation unit that calculates a voltage drop amount in the charging cable on the basis of the power supply resistance of the charging cable and a supplied current on the electric charger side or a received current on the electric vehicle side; and a charging determination unit that compares a determination voltage updated on the basis of the voltage drop amount with the supplied voltage on the electric charger side and determines a state of charge of the electric storage device.

Preferably, the determination voltage is updated by adding the voltage drop amount to a predetermined basic determination voltage.

Preferably, the electric charger performs constant-current charging in which the supplied current is raised to a predetermined current and then held at the predetermined current; the first reference setting unit detects a difference in a variation rate of the supplied voltage data between a rising process and a holding process of the supplied current and sets the reference point for the supplied voltage data at a location where the rising process is switched to the holding process; and the second reference setting unit detects a difference in a variation rate of the received voltage data between the rising process and the holding process of the supplied current and sets the reference point for the received voltage data at a location where the rising process is switched to the holding process.

Preferably, the data synchronization unit calculates a time lag between the supplied voltage data and the received voltage data on the basis of the reference points and synchronizes the supplied voltage data and the received voltage data on the basis of the time lag.

Another aspect of the present invention provides an electric charger that is connected by a charging cable to an electric vehicle having an electric storage device and that charges the electric storage device, the electric charger including: a first reference setting unit that sets a reference point for supplied voltage data calculated by subjecting a supplied voltage at the electric charger side to predetermined filter processing, the reference point being set on the basis of a variation rate of the supplied voltage data; a second reference setting unit that sets a reference point for received voltage data calculated by subjecting a received voltage at the electric vehicle side to predetermined filter processing, the reference point being set on the basis of a variation rate of the received voltage data; a data synchronization unit that synchronizes the supplied voltage data and the received voltage data on the basis of the reference points of the supplied voltage data and the received voltage data; a voltage difference calculation unit that compares the synchronized supplied voltage data and received voltage data and calculates a voltage difference between the supplied voltage and the received voltage; a resistance calculation unit that calculates a power supply resistance of the charging cable on the basis of the voltage difference between the supplied voltage and the received voltage; a drop amount calculation unit that calculates a voltage drop amount in the charging cable on the basis of the power supply resistance of the charging cable and a supplied current on the electric charger side or a received current on the electric vehicle side; and a charging determination unit that compares a determination voltage updated on the basis of the voltage drop amount with the supplied voltage on the electric charger side and determines a state of charge of the electric storage device.

Preferably, the determination voltage is updated by adding the voltage drop amount to a predetermined basic determination voltage.

Preferably, the electric charger has a constant-current charging unit that raises the supplied current to a predetermined current and then holds the current at the predetermined current when charging the electric storage device; the first reference setting unit detects a difference in a variation rate of the supplied voltage data between a rising process and a holding process of the supplied current and sets the reference point for the supplied voltage data at a location where the rising process is switched to the holding process; and the second reference setting unit detects a difference in a variation rate of the received voltage data between the rising process and the holding process of the supplied current and sets the reference point for the received voltage data at a location where the rising process is switched to the holding process.

Preferably, the data synchronization unit calculates a time lag between the supplied voltage data and the received voltage data on the basis of the reference points and synchronizes the supplied voltage data and the received voltage data on the basis of the time lag.

According to the present invention, a determination voltage that is compared with the supplied voltage at the electric charger side when the state of charge of the electric storage device is determined is updated on the basis of the voltage drop amount in the charging cable. Therefore, the state of charge of the electric storage device can be accurately determined on the basis of the supplied voltage from the electric charger, without being affected by the charging cable.

Further, since a reference point is set for the supplied voltage data on the basis of the variation rate of the supplied voltage data, and a reference point is set for the received voltage data on the basis of the variation rate of the received voltage data, the supplied voltage data and the received voltage data can be synchronized on the basis of the reference point. As a result, the difference in voltage between the supplied voltage data and the received voltage data can be accurately calculated, the voltage drop amount in the charging cable can be accurately calculated, and the determination voltage can be accurately updated.

DESCRIPTION OF THE PREFERRED EMBODIMENTS

Figure 1:
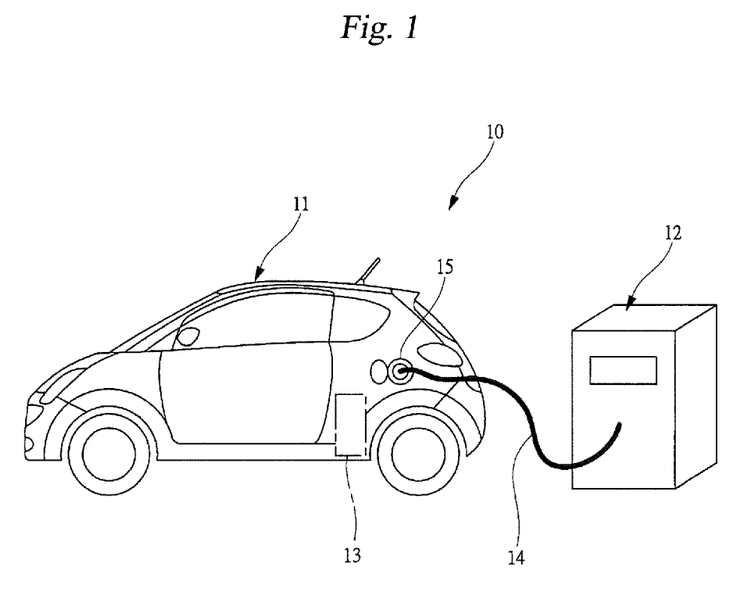
FIG. 1 is schematic diagram illustrating charging performed with an electric charging system according to an embodiment of the present invention.
Figure 2:
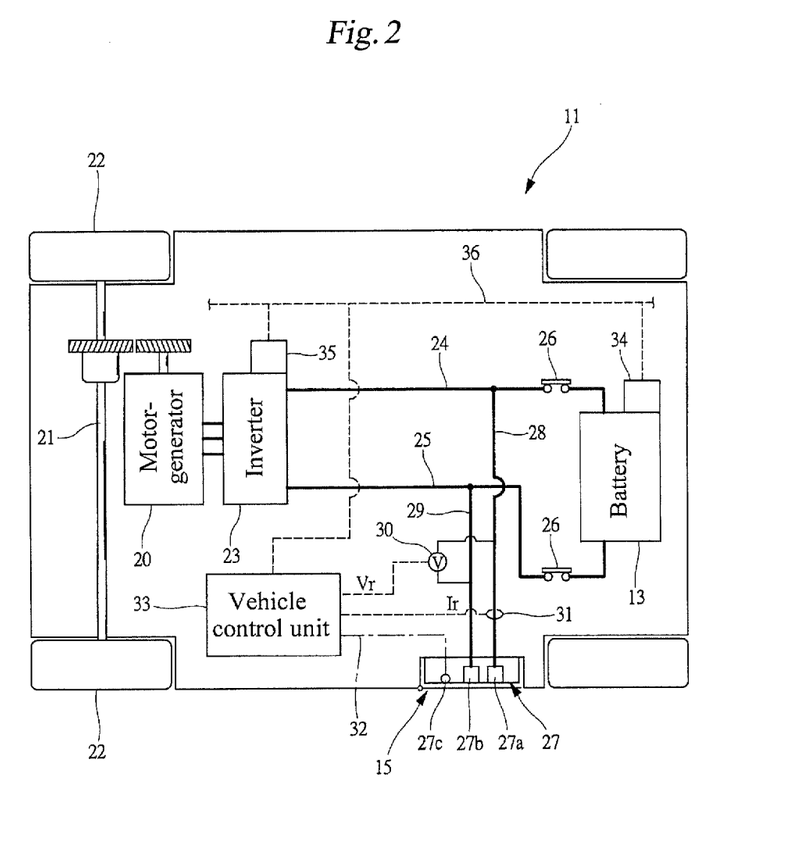
FIG. 2 is a schematic diagram showing the internal structure of an electric vehicle constituting the electric charging system.
Figure 3:
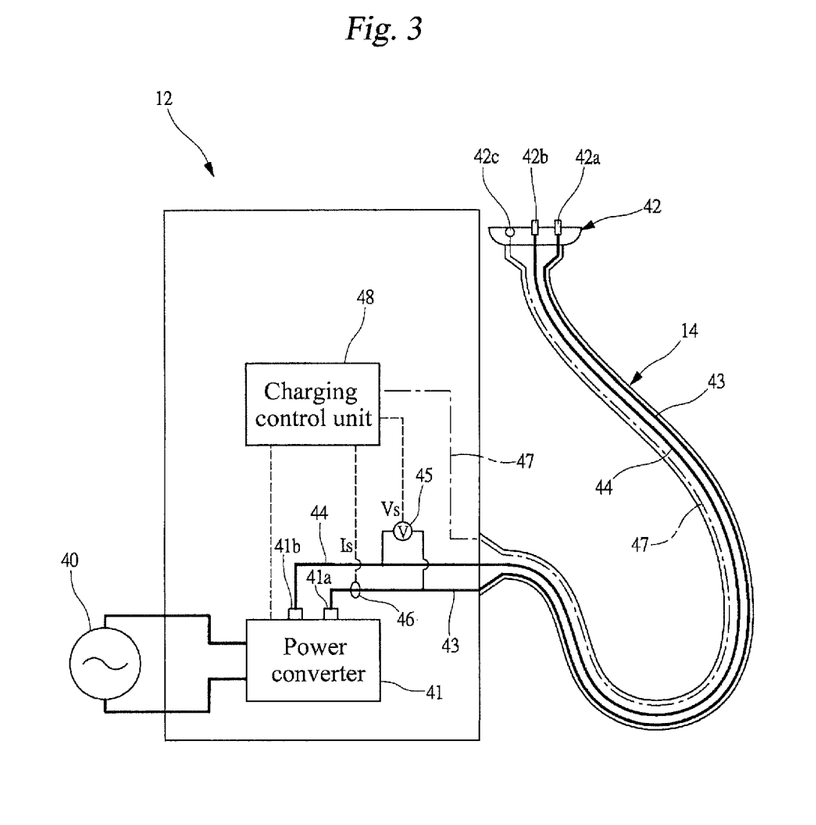
FIG. 3 is a schematic diagram showing the internal structure of an electric charger constituting the electric charging system.

An embodiment of the present invention will hereunder be described with reference to the drawings. FIG. 1 is schematic diagram illustrating charging performed with an electric charging system 10 according to an embodiment of the present invention. FIG. 2 is a schematic diagram showing the internal structure of an electric vehicle 11 constituting the electric charging system 10. FIG. 3 is a schematic diagram showing the internal structure of an electric charger 12 constituting the electric charging system 10. As shown in FIG. 1, the electric vehicle 11 is equipped with a battery 13 as an electric storage device. When the battery 13 is charged, a charging cable 14 of the electric charger 12 is connected to a charging port 15 of the electric vehicle 11. The electric charger 12 charges the battery 13 to a predetermined voltage, while controlling the charging current or charging voltage supplied to the electric vehicle 11. The electric charger 12 can use a constant-current charging method in which the battery 13 is charged at a constant current, a constant-voltage charging method in which the battery 13 is charged at a constant voltage, a constant-power charging method in which the battery 13 is charged at a constant power, and a constant-current and constant-voltage charging method in which the constant-current charging and constant-voltage charging are switched by a timer and the like.

As shown in FIG. 2, the electric vehicle 11 includes a motor-generator 20 for propulsion. The motor-generator 20 is connected to drive wheels 22 by a drive axle 21. The motor-generator 20 and the battery 13 are connected by an inverter 23 that bidirectionally converts DC power and AC power. A main relay 26 is provided in electric power lines 24 and 25 that connect the battery 13 and the inverter 23. A power receiving connector 27 is provided in the electric charging port 15 at a side of the vehicle body. The power receiving connector 27 is provided with a pair of power receiving terminals 27a, and 27b. The power receiving terminal 27a, is connected to the electric power line 24 at a side of a positive electrode, via a power receiving line 28. The power receiving terminal 27b, is connected to the electric power line 25 at a side of a negative electrode, via a power receiving line 29. The electric vehicle 11 is also provided with a voltage sensor 30 that detects a voltage between the power receiving lines 28 and 29, that is, a received voltage Vr, and a current sensor 31 that detects a current in the power receiving line 28, that is, a received current Ir. The power receiving connector 27 is provided with a signal terminal 27c, and a communication line 32 is connected to the signal terminal 27c. The electric vehicle 11 is also provided with a vehicle control unit 33 that integrally controls the entire vehicle, a battery control unit 34 that controls the battery 13, and a motor control unit 35 that controls the inverter 23. The control units 33 to 35 are connected to each other via a communication network 36. Each of the control units 33 to 35 is equipped with a CPU, a memory and the like.

As shown in FIG. 3, the electric charger 12 is provided a power converter 41 that converts AC power from an external power source 40 to DC power for charging. The power converter 41 includes a rectifier circuit, an electric transformer, a switching circuit and the like. An end of the charging cable 14 of the electric charger 12 is provided with a power supply connector 42 that is attachable and detachable with respect to the power receiving connector 27. The power supply connector 42 has a pair of power supply terminals 42a, and 42b, that correspond to the power receiving terminals 27a, and 27b, of the power receiving connector 27. The power supply terminal 42a is connected to a positive electrode terminal 41a, of the power converter 41 via a power supply line 43, while the power supply terminal 42b, is connected to a negative electrode terminal 41b, of the power converter 41 via a power supply line 44. The electric charger 12 has a voltage sensor 45 that detects a voltage between power supply lines 43 and 44, that is, a supplied voltage Vs, and a current sensor 46 that detects a current in the power supply line 43, that is, a supplied current Is. The power supply connector 42 has a signal terminal 42c. A communication line 47 is connected to the signal terminal 42c. The electric charger 12 includes a charging control unit 48 that is constituted by a CPU, a memory and the like. Control signals are outputted from the charging control unit 48 to the power converter 41.

Figure 4:
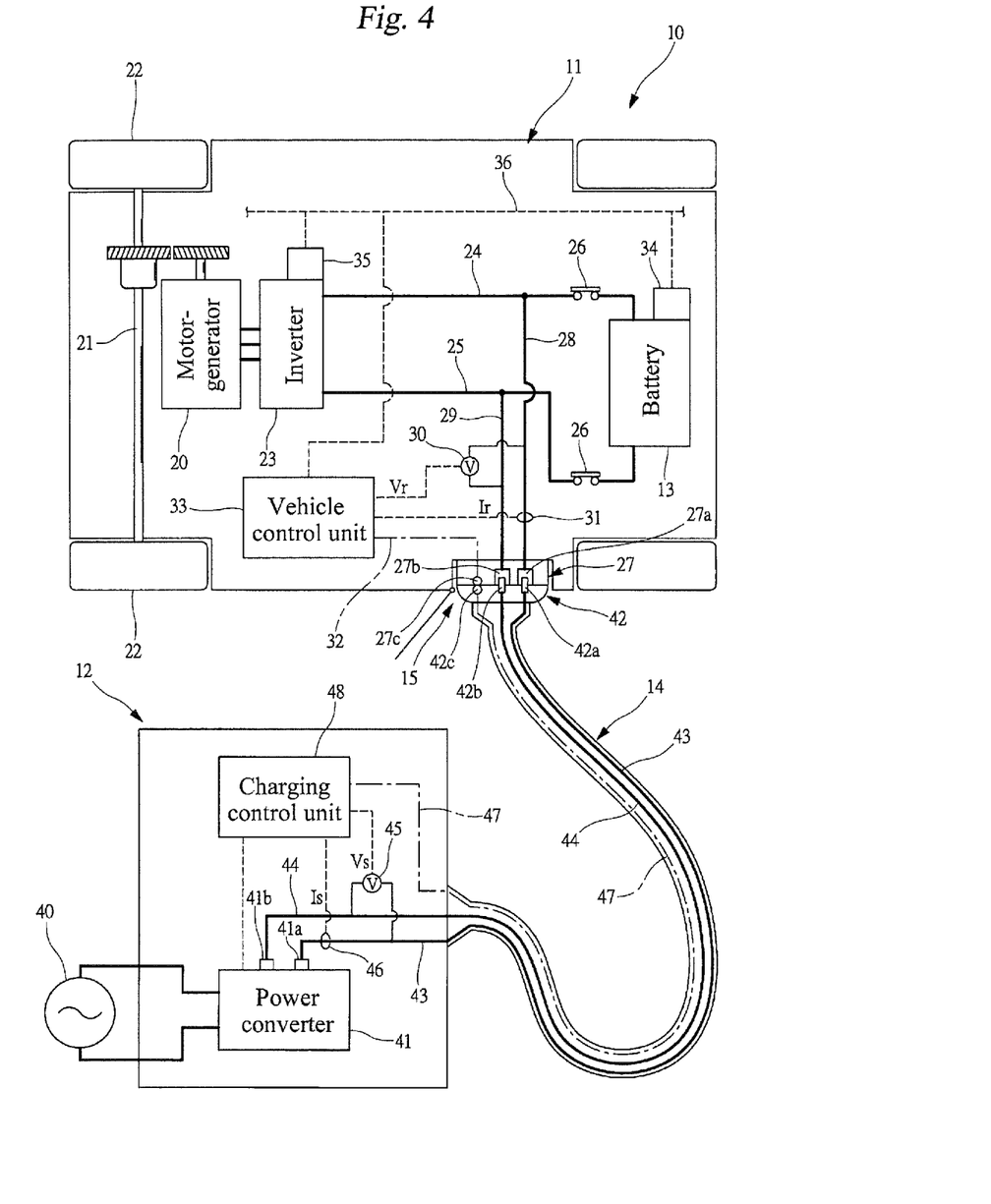
FIG. 4 is a schematic diagram illustrating a state in which the charging cable of the electric charger is connected to the charging port of the electric vehicle.

FIG. 4 is a schematic diagram showing a state where the charging cable 14 of the electric charger 12 is connected to the charging port 15 of the electric vehicle 11. As shown in FIG. 4, when the power supply connector 42 of the charging cable 14 is connected to the power receiving connector 27 of the charging port 15, a state is assumed in which the power converter 41 and the battery 13 are connected by the power supply lines 43 and 44 and the power receiving lines 28 and 29. Further, when the power supply connector 42 of the charging cable 14 is connected to the power receiving connector 27 of the charging port 15, a state is assumed in which the vehicle control unit 33 and the charging control unit 48 are connected by the communication lines 32 and 47. Where the electric charger 12 and the electric vehicle 11 are thus connected, the charging control unit 48 of the electric charger 12 continues charging the battery 13, as described hereinbelow, till the supplied voltage Vs reaches a predetermined determination voltage Xb. Thus, the charging control unit 48 determines whether or not the battery 13 has reached the fully charged state (for example, SOC=80%) on the basis of the supplied voltage Vs detected at the electric charger side.

Figure 5:
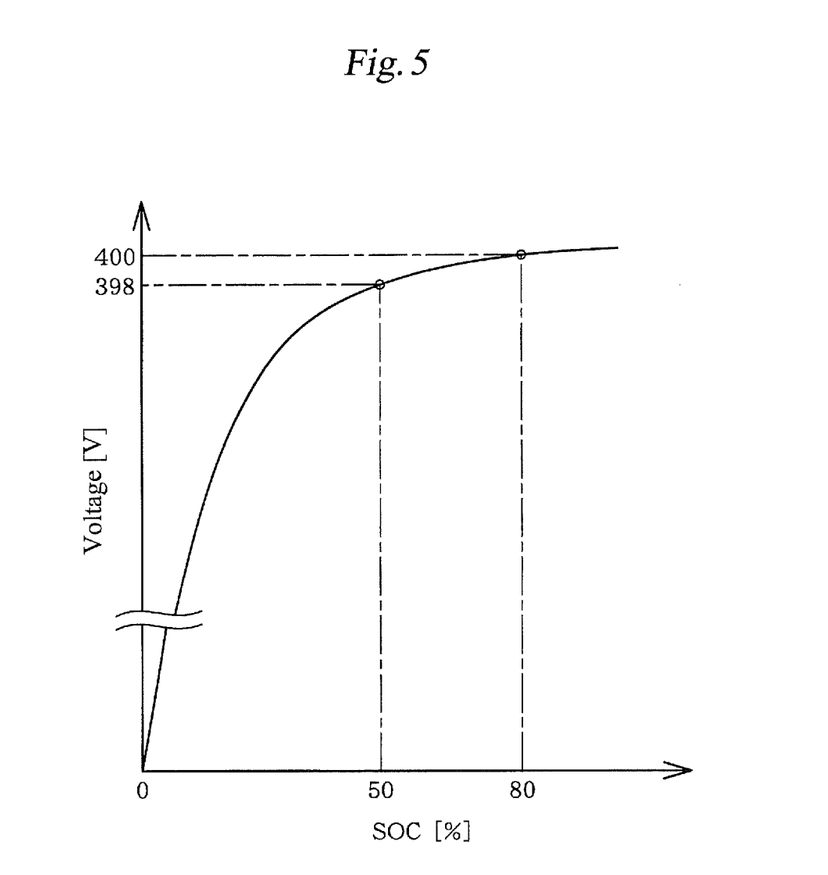
FIG. 5 is a linear diagram illustrating an example of a battery charge-discharge characteristic.

However, since the charging cable 14 that is connected to the electric vehicle 11 has an electric resistance (power supply resistance) R, a voltage drop occurs in the charging cable 14 during charging. Thus, the supplied voltage Vs and the received voltage Vr are separated by a voltage drop amount $\Delta Va$ in the charging cable 14. Thus, because of a voltage drop in the charging cable 14, the supplied voltage Vs at the electric charger side and the received voltage Vr at the electric vehicle side do not coincide and therefore even when the charging is continued till the supplied voltage Vs at the electric charger side reaches the predetermined target voltage, the fully charged state of the battery 13 is difficult to ensure. FIG. 5 is a linear diagram showing an example of the charge-discharge characteristic of the battery 13. As shown in FIG. 5, when the state of charge SOC of the battery 13 is 50%, the battery voltage is 398 V, and when the state of charge SOC of the battery 13 is 80%, the battery voltage is 400 V. Thus, in the case of a charge-discharge characteristic such that a slight difference in battery voltage corresponds to a large difference in the state of charge SOC, the fully charged state of the battery 13 is difficult to determine on the basis of the supplied voltage Vs at the electric charger side. For example, when the voltage drop amount $\Delta Va$ of the charging cable 14 is 2 V, even when the battery 13 is charged till the supplied voltage Vs at the electric charger side reaches 400 V with the object of obtaining a fully charged state (for example, SOC=80%), the received voltage Vr at the electric vehicle side, that is, the battery voltage, reaches only 398 V. Thus, when the battery 13 has the charge-discharge characteristic shown in FIG. 5, the electric charger 12 erroneously determines that the battery 13 is in a fully charged state and stops charging the battery 13, although the battery 13 is in an incompletely charged state (SOC=50%).

Accordingly, the charging control unit 48 calculates the voltage drop amount $\Delta Va$ in the charging cable 14 and also updates, on the basis of the voltage drop amount $\Delta Va$, the determination voltage Xb that will be compared with the supplied voltage Vs during charging. First, the charging control unit 48 functioning as a voltage difference calculation unit and a resistance calculation unit calculates the voltage difference (difference in electric potential between the power supply line 43 and the power receiving line 28) $\Delta V$ between the supplied voltage Vs and the received voltage Vr and then calculates an electric resistance R ($R=\Delta V/Is$) on the basis of the voltage difference $\Delta V$ and the supplied current Is. The received current Ir may be used instead of the supplied current Is when the electric resistance R of the charging cable 14 is calculated. Further, the electric resistance R is considered as the power supply resistance of the charging cable 14, but such selection is not limiting, and when the power supply resistance of the charging cable 14 is regulated by an impedance Z, the impedance Z may be used instead of the electric resistance R. Thus, the received voltage Vr or supplied voltage Vs is used when calculating the electric resistance R of the charging cable 14, but when the received voltage Vr or supplied voltage Vs detected by the voltage sensors 30 and 45 are used, it is necessary to eliminate the effect of noise by performing filter processing such as moving average processing or weighted average processing.

Figure 6:
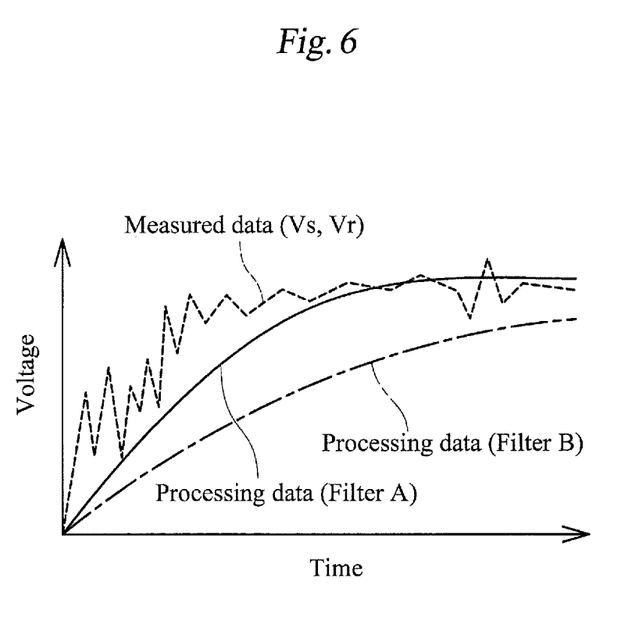
FIG. 6 is an explanatory drawing illustrating the effect produced by the filter processing on the received voltage or supplied voltage.

FIG. 6 is an explanatory drawing illustrating the effect of filter processing on the received voltage Vr and supplied voltage Vs. As shown in FIG. 6, when the actually measured data detected by the voltage sensors 30 and 45 are subjected to filter processing and the filter-processed data are obtained from the actually measured data, a time lag occurs between the actually measured data and the processed data. The length of the time lag caused by the filter processing varies depending on the contents of the filter processing. Thus, when there is a difference between the filter processing performed with respect to the received voltage Vr at the electric vehicle side and the filter processing performed with respect to the supplied voltage Vs at the electric charger side, a time lag occurs between the received voltage data Dr based on the received voltage Vr and the supplied voltage data Ds based on the supplied voltage Vs. Therefore, in order to compare the supplied voltage data Ds with the received voltage data Dr and calculate accurately the voltage difference $\Delta V$, it is necessary to determine the time lag and compare the supplied voltage data Ds with the received voltage data Dr after the data have been synchronized.

Accordingly, the charging control unit 48 detects the time lag between the received voltage data Dr and the supplied voltage data Ds during charging and synchronizes the received voltage data Dr with the supplied voltage data Ds on the basis of the time lag. Then, the charging control unit 48 compares the synchronized received voltage data Dr and supplied voltage data Ds and calculates the voltage difference $\Delta V$ between the supplied voltage Vs and the received voltage data Vr. The procedure for calculating the voltage difference $\Delta V$ with high accuracy is explained below. In the present embodiment, the received voltage data Dr are calculated by the vehicle control unit 33, and the supplied voltage data Ds are calculated by the charging control unit 48. The received voltage data Dr calculated by the vehicle control unit 33 are transmitted to the charging control unit 48 via the communication lines 32 and 47.

Figure 7:
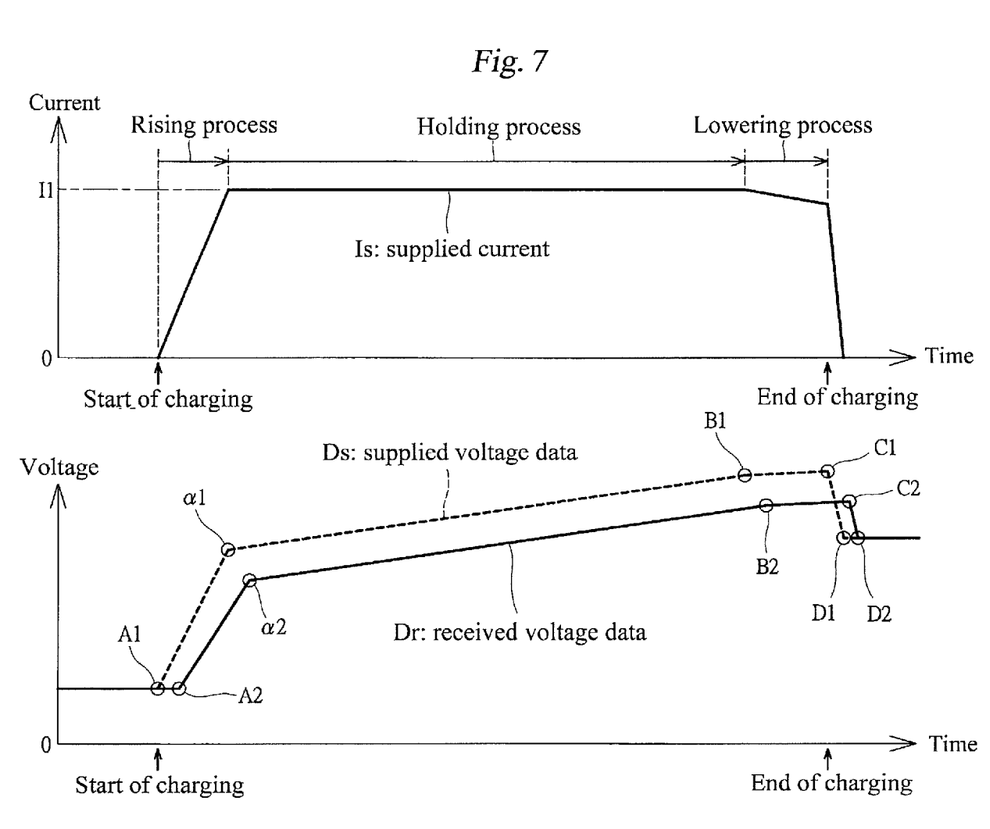
FIG. 7 is a linear diagram illustrating the variation state of supplied current, supplied voltage data, and received voltage data during charging.

FIG. 7 is a diagram illustrating the variation states of the supplied current Is, supplied voltage data Ds, and received voltage data Dr during charging. The charging control unit 48 functions as a constant-current charging unit and, as shown in FIG. 7, the electric charger 12 charges the battery 13 by constant-current charging. The electric charger 12 rises the supplied current Is to a predetermined current I1 at a predetermined rise speed from the start of charging (rising process) and then performs the adjustment to hold the supplied current Is at the predetermined current I1, while increasing the supplied voltage Vs (holding process). The holding process is continued till the received voltage Vr at the battery side reaches a predetermined target voltage. In the subsequent lowering process, the electric charger 12 continues the charging till the received voltage Vr reaches the final target voltage, while gradually lowering the supplied current Is. In such constant-current charging, the supplied voltage Vs and the received voltage Vr, that is, the supplied voltage data Ds and the received voltage data Dr, increase rapidly at a first rise speed in the rising process and increase gradually at a second rise speed, which is less than the first rise speed, in the holding process.

Figure 8:
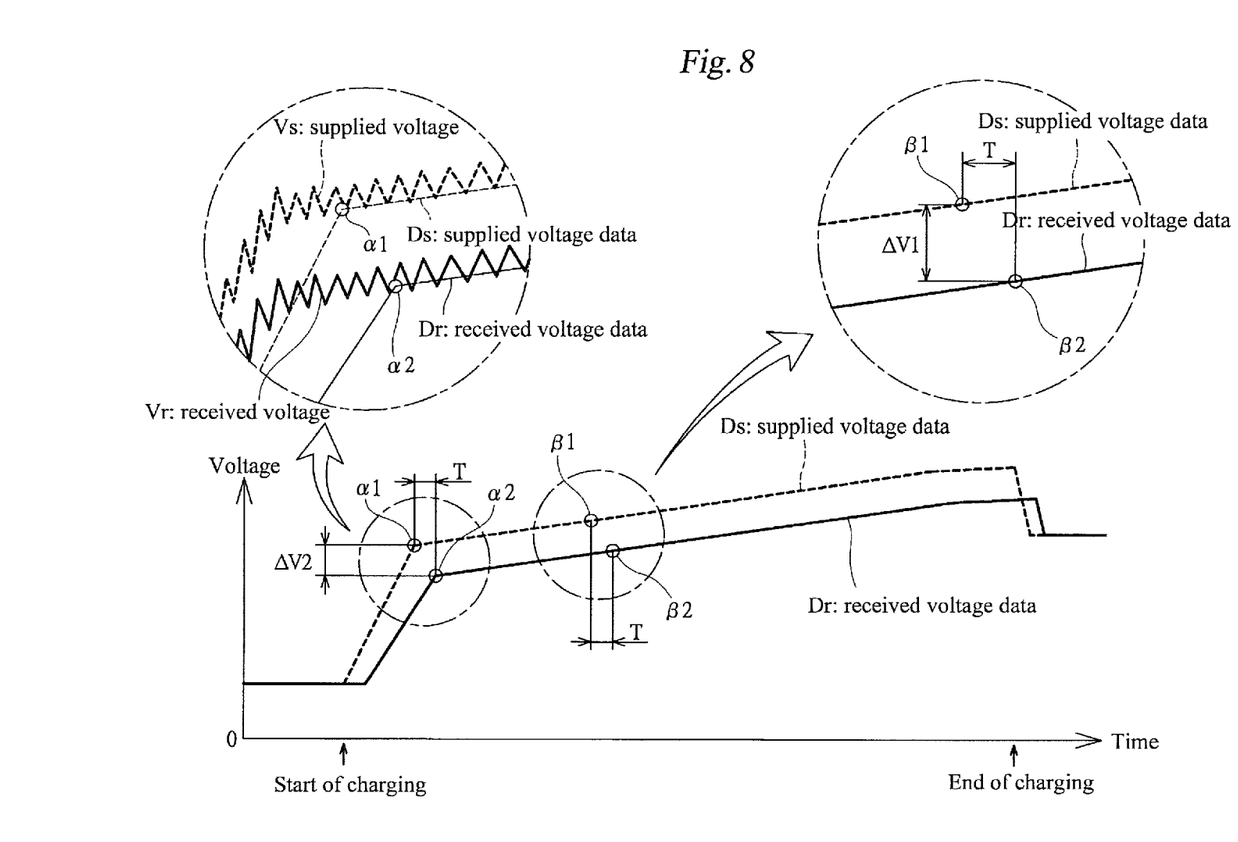
FIG. 8 is an explanatory drawing illustrating the variation state of supplied voltage data and received voltage data during charging.

FIG. 8 is an explanatory drawing illustrating the variation state of the supplied voltage data Ds and received voltage data Dr during charging. In the explanatory drawing in FIG. 8, the linear diagram of the supplied voltage data Ds and received voltage data Dr shown in FIG. 7 is provided with explanations. As shown in FIG. 8, the charging control unit 48 functioning as a first reference setting unit sets a reference point α1 for the supplied voltage data Ds at a location where the rising process is switched to the holding process on the basis of a difference in the rise speed (variation rate) of the supplied voltage data Ds between the rising process and the holding process. Thus, a point in which the rise speed of the supplied voltage data Ds varies in excess of a predetermined value is set as the reference point α1. Likewise, the charging control unit 48 functioning as a second reference setting unit sets a reference point α2 for the received voltage data Dr at a location where the rising process is switched to the holding process on the basis of a difference in the rise speed (variation rate) of the received voltage data Dr between the rising process and the holding process. Thus, a point in which the rise speed of the received voltage data Dr varies in excess of a predetermined value is set as the reference point α2. Further, since the power supply lines 43 and 44 where the supplied voltage Vs is measured and the reception lines 28 and 29 where the received voltage Vr is measured are connected, the rise speed of the supplied voltage Vs and the rise speed of the received voltage Vr change at the same timing as shown in the enlarged view in FIG. 8. Since the rise speed of the supplied voltage data Ds for which the supplied voltage Vs serves as a basis and the rise speed of the received voltage data Dr for which the received voltage Vr serves as a basis thus change at the same timing, the reference points α1 and α2 are at the same timing.

Since the reference point α1 of the supplied voltage data Ds and the reference point α2 of the received voltage data Dr are thus at the same timing, the charging control unit 48 functioning as a data synchronization unit measures the time interval between the reference point α1 and the reference point α2 and calculates a time lag T (for example, 0.5 sec) between the supplied voltage data Ds and the received voltage data Dr caused by the filter processing. Then, the charging control unit 48 functioning as a voltage difference calculation unit compares the supplied voltage data Ds (symbol β1) and the received voltage data Dr (symbol β2) by taking the time lag T into account and calculates a voltage difference ΔV1 between the supplied voltage data Ds (supplied voltage Vs) and the received voltage data Dr (received voltage Vr). Then, the charging control unit 48 calculates the electric resistance R of the charging cable 14 on the basis of the voltage difference ΔV1 and the supplied current Is at a point of time when the voltage difference ΔV1 has been calculated.

Thus, the supplied voltage data Ds and the received voltage data Dr can be compared with each other at the same timing, and the voltage difference ΔV1 and electric resistance R can be calculated with good accuracy. Furthermore, the fact that the reference points α1 and α2 have been set for the supplied voltage data Ds and the received voltage data Dr means that the values detected by the voltage sensors 30 and 45 track voltage variations during constant-current charging and therefore normal operation of both voltage sensors 30 and 35 can be determined. In the explanation above, the voltage difference ΔV1 is calculated by comparing the supplied voltage data Ds with the received voltage data Dr after the reference points α1 and α2 have been set for the supplied voltage data Ds and the received voltage data Dr, but such a procedure is not limiting and, as shown in FIG. 8, a voltage difference ΔV2 may be also calculated at a point of time when the reference points α1 and α2 are set.

Figure 9:
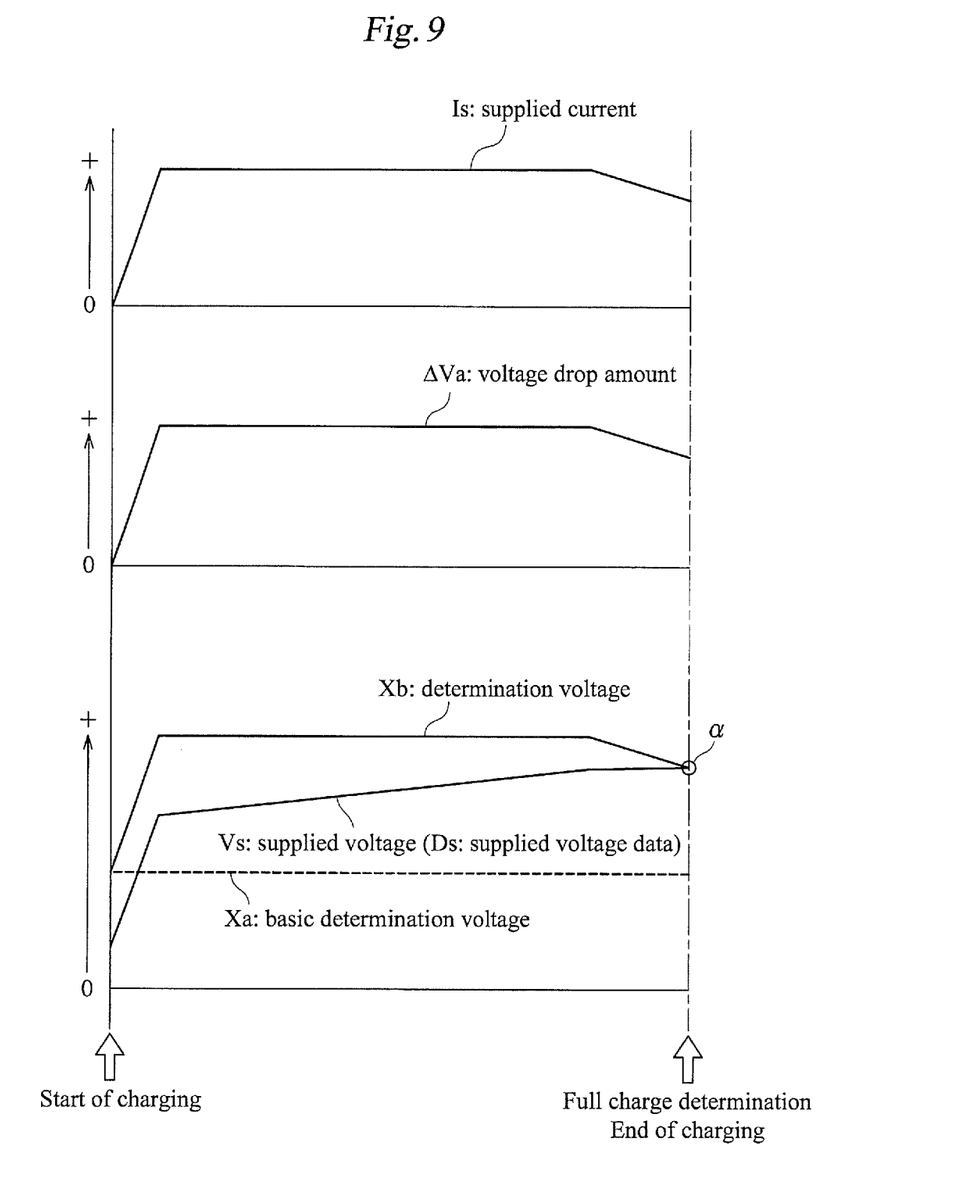
FIG. 9 is a linear diagram illustrating an example of variations of the determination voltage from the start of charging to the end of charging.

As mentioned hereinabove, where the electric resistance R of the charging cable 14 is calculated, the charging control unit 48 functioning as a drop amount calculation unit calculates a voltage drop amount ΔVa (ΔVa=Is×R) in the charging cable 14 on the basis of the electric resistance R and the supplied current Is. Then, the charging control unit 48 adds the voltage drop amount ΔVa to a basic determination voltage Xa that is set in advance and calculates the determination voltage Xb (Xb=Xa+ΔVa) that will be compared with the supplied voltage Vs. The calculation of the determination voltage Xb is repeated for each predetermined time period, and the determination voltage Xb is updated, while tracking the variations in the supplied current Is. FIG. 9 is a linear diagram illustrating an example of variations of the determination voltage Xb from the start of charging to the end of charging. Since the electric resistance R of the charging cable 14 is constant, as shown in FIG. 9, the voltage drop amount ΔVa in the charging cable 14 varies in response to the variations in the supplied current Is in constant-current charging. Therefore, the determination voltage Xb obtained by adding the voltage drop amount ΔVa also varies in response to the variations in the supplied current Is. Further, since the internal resistance of the battery 13 increases in the course of charging, the supplied voltage Vs increases gradually to maintain a constant supplied current Is. Further, as indicated by the symbol α, where the supplied voltage Vs (supplied voltage data Ds) reaches the determination voltage Xb, the charging control unit 48 determines that the battery 13 has reached the fully charged state and ends the charging.

Figure 10:
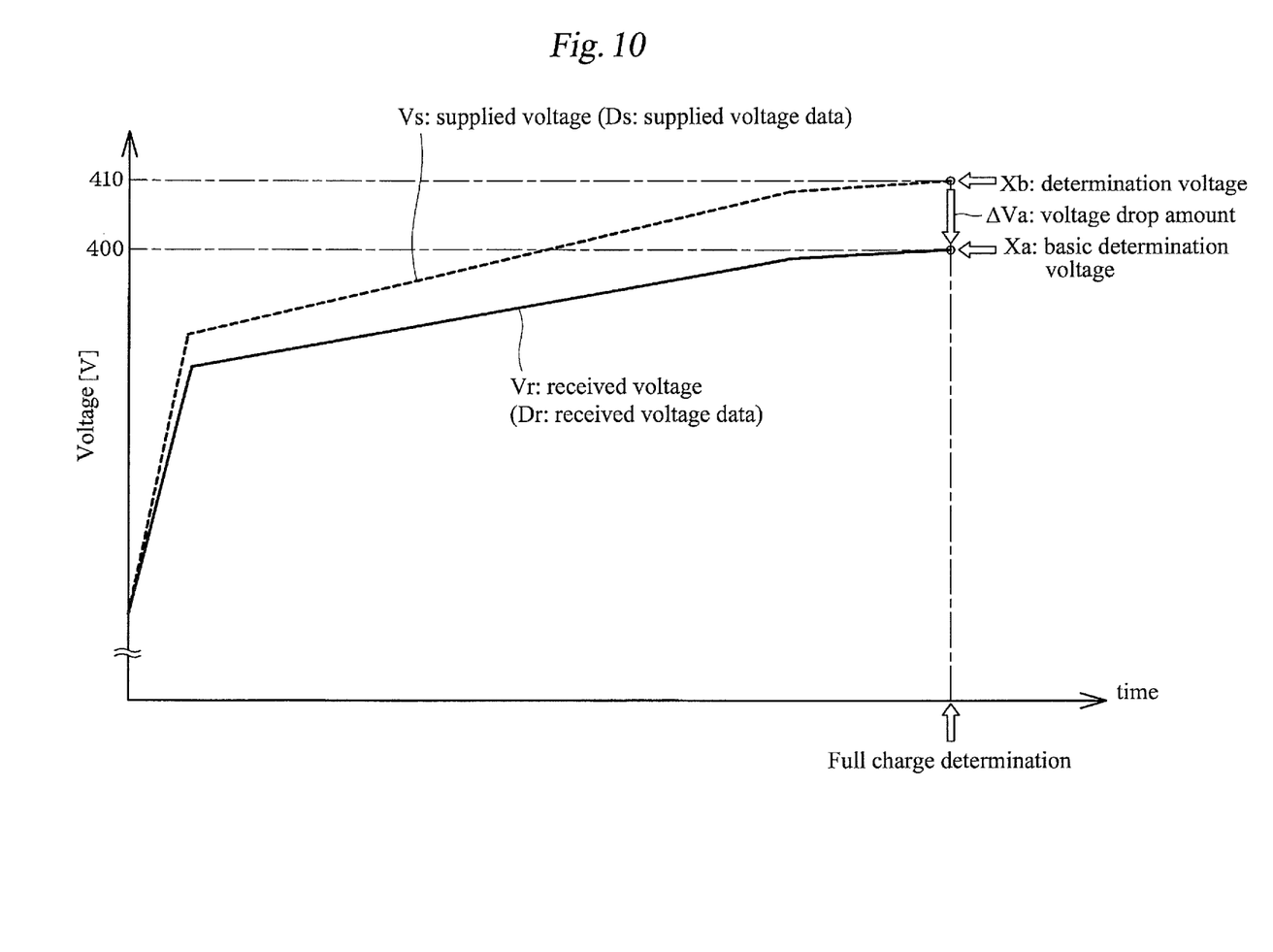
FIG. 10 is a linear diagram illustrating an example of transition of the supplied voltage and received voltage during charging.

FIG. 10 is a linear diagram illustrating an example of transition of the supplied voltage Vs and the received voltage Vr during charging. As shown in FIG. 10, the determination voltage Xb which is to be compared with the supplied voltage Vs is raised by the amount corresponding to the voltage drop amount ΔVa in the charging cable 14. Therefore, the fully charged state of the battery 13 can be determined on the basis of the supplied voltage Vs and the determination voltage Xb. Thus, as a result of setting the basic determination voltage Xa to a battery voltage (for example, 400 V) corresponding to the fully charged state of the battery 13, when the supplied voltage Vs reaches the determination voltage Xb (for example, 410 V), the received voltage Vr at the battery side reaches the basic determination voltage Xa (for example, 400 V). Thus, by raising the determination voltage Xb by the voltage drop amount ΔVa, it is possible to avoid the erroneous determination of the fully charged state with the charging control unit 48 and avoid incomplete charging of the battery 13. Further, since the charging control unit 48 calculates the electric resistance R of the charging cable 14, the voltage drop amount ΔVa can be determined with good accuracy and the determination voltage Xb can be updated with good accuracy. Thus, as a result of adjusting the length of the charging cable 14 according to the type of the charging facility or the like, the electric resistance R is calculated for each individual charging cable 14, instead of using the preset electric resistance R. Therefore, the voltage drop amount ΔVa can be determined with good accuracy and the determination voltage Xb can be updated with good accuracy.

In the explanation hereinabove, the reference point α1 is set on the basis of the rise speed of the supplied voltage data Ds in the charging process, and the reference point α2 is set on the basis of the rise speed of the received voltage data Dr in the charging process in order to calculate the voltage difference ΔV1 between the supplied voltage data Ds and the received voltage data Dr. Since the reference points α1 and α2 are thus set by using variations in the rise speed that appear in the usual charging process, it is not necessary to change intentionally the supplied voltage Vs or supplied current Is in order to set the reference points α1 and α2. Thus, it is not necessary to change the specifications of the existing electric charger 12 to control the supplied voltage Vs or supplied current Is, and the present invention can be used, while reducing the cost.

Further, in the explanation above, the reference points α1 and α2 located at the boundary of the rising process and holding process are set as reference points for the supplied voltage data Ds and the received voltage data Dr, but such configuration is not limiting, and the timing at which a variation in the variation rate (variation speed) appears in the supplied voltage data Ds and the received voltage data Dr may be also used. For example, as shown in FIG. 7, reference points A1 and A2, which indicate the timing of the start of charging, and reference points B1 and B2 that are positioned at the boundary of the holding process and lowering process may be also used. Further, reference points C1 and C2, which indicate the timing of the end of charging (current interruption), may be used and reference point D1 and D2, which indicate the timing at which the received voltage Vr and the supplied voltage Vs converge to the battery voltage after the end of charging, may be also used. Further, in the explanation above, the battery 13 is charged at a constant current, but such feature is not limiting, and the present invention may be also used when the battery 13 is charged at a constant voltage, at a constant power, or at a constant current and constant voltage. The present invention is not limited to the above-described embodiments, and it goes without saying that various changes may be made without departing from the scope of the invention. In the explanation above, the charging control unit 48 is caused to function as the first reference setting unit, second reference setting unit, data synchronization unit, voltage difference calculation unit, resistance calculation unit, drop amount calculation unit, charging determination unit, and constant-current charging unit, but such configuration is not limiting. For example, the first reference setting unit, second reference setting unit, data synchronization unit, voltage difference calculation unit, resistance calculation unit, drop amount calculation unit, charging determination unit, and constant-current charging unit may be aggregated with either of the charging control unit 48 and the vehicle control unit 33, or may be distributed to both the charging control unit 48 and the vehicle control unit 33. Further, in the explanation above, the vehicle control unit 33 calculates the received voltage data Dr, but when the charging control unit 48 is caused to calculate the received voltage data Dr, the received voltage Vr is transmitted to the charging control unit 48 via the communication lines 32 and 47. Likewise, the charging control unit 48 calculates the supplied voltage data Ds, but when the vehicle control unit 33 is caused to calculate supplied voltage data Ds, the supplied voltage Vs is transmitted to the vehicle control unit 33 via the communication lines 32 and 47.

In the explanation above, the fully charged state is indicated to correspond to a state of charge SOC of 80%, but the fully charged state varies depending on the designed battery usage range (upper limit value of SOC) and is not limited to that corresponding to a state of charge SOC of 80%. Further, the moving average processing and weighted average processing are considered as the filter processing methods to be used for calculating the received voltage data Dr or the supplied voltage data Ds, but such processing methods are not limiting. For example, the filter processing may be performed with hardware by using an electric circuit, or with software by using a program. Further, it goes without saying that the filter processing such as moving average processing may be also implemented when using the supplied current Is or received current Ir detected by the current sensors 31 and 46.

Further, the illustrated electric vehicle 11 shown in the figures is an electric vehicle which has only the motor-generator 20 for propulsion, but it may also be a hybrid electric vehicle that includes the motor-generator 20 and an engine for propulsion. Further, the battery 13 such as a lithium-ion secondary battery and a nickel hydride secondary battery is used as the electric storage device, but the present invention is not limited to such configuration. Thus, a capacitor such as a lithium-ion capacitor and an electric double layer capacitor may be used as the electric storage device. Furthermore, in the explanation above, the electric charger 12 of a conductive system is used in which a contact-type power supply connector 42 is provided at the charging cable 14, but such configuration is not limiting and an inductive-type electric charger in which a contactless power supply connector is provided at the charging cable 14 may be also used.

What is claimed is:

1. An electric charging system in which an electric charger and an electric vehicle are connected by a charging cable, and an electric storage device installed on the electric vehicle is charged, the electric charging system comprising:
   a first reference setting unit for setting a reference point for supplied voltage data calculated by subjecting a supplied voltage at the electric charger side to predetermined filter processing, the reference point being set on the basis of a variation rate of the supplied voltage data;
   a second reference setting unit for setting a reference point for received voltage data calculated by subjecting a received voltage at the electric vehicle side to predetermined filter processing, the reference point being set on the basis of a variation rate of the received voltage data;
   a data synchronization unit for synchronizing the supplied voltage data and the received voltage data on the basis of the reference points of the supplied voltage data and the received voltage data;
   a voltage difference calculation unit for comparing the synchronized supplied voltage data and received voltage data and calculates a voltage difference between the supplied voltage and the received voltage;

a resistance calculation unit for calculating a power supply resistance of the charging cable on the basis of the voltage difference between the supplied voltage and the received voltage;

a drop amount calculation unit for calculating a voltage drop amount in the charging cable on the basis of the power supply resistance of the charging cable and a supplied current on the electric charger side or a received current on the electric vehicle side; and a charging determination unit for comparing a determination voltage updated on the basis of the voltage drop amount with the supplied voltage on the electric charger side and determines a state of charge of the electric storage device.

2. The electric charging system according to claim 1, wherein the determination voltage is updated by adding the voltage drop amount to a predetermined basic determination voltage.

3. The electric charging system according to claim 1, wherein the electric charger performs constant-current charging in which the supplied current is raised to a predetermined current and then held at the predetermined current;

the first reference setting unit detects a difference in a variation rate of the supplied voltage data between a rising process and a holding process of the supplied current and sets the reference point for the supplied voltage data at a location where the rising process is switched to the holding process; and the second reference setting unit detects a difference in a variation rate of the received voltage data between the rising process and the holding process of the supplied current and sets the reference point for the received voltage data at a location where the rising process is switched to the holding process.

4. The electric charging system according to claim 2, wherein the electric charger performs constant-current charging in which the supplied current is raised to a predetermined current and then held at the predetermined current;

the first reference setting unit detects a difference in a variation rate of the supplied voltage data between a rising process and a holding process of the supplied current and sets the reference point for the supplied voltage data at a location where the rising process is switched to the holding process; and the second reference setting unit detects a difference in a variation rate of the received voltage data between the rising process and the holding process of the supplied current and sets the reference point for the received voltage data at a location where the rising process is switched to the holding process.

5. The electric charging system according to claim 1, wherein the data synchronization unit calculates a time lag between the supplied voltage data and the received voltage data on the basis of the reference points and synchronizes the supplied voltage data and the received voltage data on the basis of the time lag.

6. The electric charging system according to claim 2, wherein the data synchronization unit calculates a time lag between the supplied voltage data and the received voltage data on the basis of the reference points and synchronizes the supplied voltage data and the received voltage data on the basis of the time lag.

7. The electric charging system according to claim 3, wherein the data synchronization unit calculates a time lag between the supplied voltage data and the received voltage data on the basis of the reference points and synchronizes the supplied voltage data and the received voltage data on the basis of the time lag.

8. The electric charging system according to claim 4, wherein the data synchronization unit calculates a time lag between the supplied voltage data and the received voltage data on the basis of the reference points and synchronizes the supplied voltage data and the received voltage data on the basis of the time lag.

9. An electric charger connected by a charging cable to an electric vehicle having an electric storage device and configured to charge the electric storage device, the electric charger comprising:

a first reference setting unit for setting a reference point for supplied voltage data calculated by subjecting a supplied voltage at the electric charger side to predetermined filter processing, the reference point being set on the basis of a variation rate of the supplied voltage data;

a second reference setting unit for setting a reference point for received voltage data calculated by subjecting a received voltage at the electric vehicle side to predetermined filter processing, the reference point being set on the basis of a variation rate of the received voltage data;

a data synchronization unit for synchronizing the supplied voltage data and the received voltage data on the basis of the reference points of the supplied voltage data and the received voltage data;

a voltage difference calculation unit for comparing the synchronized supplied voltage data and received voltage data and calculates a voltage difference between the supplied voltage and the received voltage;

a resistance calculation unit for calculating a power supply resistance of the charging cable on the basis of the voltage difference between the supplied voltage and the received voltage;

a drop amount calculation unit for calculating a voltage drop amount in the charging cable on the basis of the power supply resistance of the charging cable and a supplied current on the electric charger side or a received current on the electric vehicle side; and a charging determination unit for comparing a determination voltage updated. on the basis of the voltage drop amount with the supplied voltage on the electric charger side and determines a state of charge of the electric storage device.

10. The electric charger according to claim 9, wherein the determination voltage is updated by adding the voltage drop amount to a predetermined basic determination voltage.

11. The electric charger according to claim 9, further comprising a constant-current charging unit for raising the supplied current to a predetermined current and then holds the current at the predetermined current when charging the electric storage device, wherein the first reference setting unit detects a difference in a variation rate of the supplied voltage data between a rising process and a holding process of the supplied current and sets the reference point for the supplied voltage data at a location where the rising process is switched to the holding process; and the second reference setting unit detects a difference in a variation rate of the received voltage data between the rising process and the holding process of the supplied current and sets the reference point for the received voltage data at a location where the rising process is switched to the holding process.

12. The electric charger according to claim 10, further comprising a constant-current charging unit for raising the supplied current to a predetermined current and then holds the current at the predetermined current when charging the electric storage device,
wherein the first reference setting unit detects a difference in a variation rate of the supplied voltage data between a rising process and a holding process of the supplied current and sets the reference point for the supplied voltage data at a location where the rising process is switched to the holding process; and
the second reference setting unit detects a difference in a variation rate of the received voltage data between the rising process and the holding process of the supplied current and sets the reference point for the received voltage data at a location where the rising process is switched to the holding process.

13. The electric charger according to claim 9, wherein
the data synchronization unit calculates a time lag between the supplied voltage data and the received voltage data on the basis of the reference points and synchronizes the supplied voltage data and the received voltage data on the basis of the time lag.

14. The electric charger according to claim 10, wherein
the data synchronization unit calculates a time lag between the supplied voltage data and the received voltage data on the basis of the reference points and synchronizes the supplied voltage data and the received voltage data on the basis of the time lag.

15. The electric charger according to claim 11, wherein
the data synchronization unit calculates a time lag between the supplied voltage data and the received voltage data on the basis of the reference points and synchronizes the supplied voltage data and the received voltage data on the basis of the time lag.

16. The electric charger according to claim 12, wherein
the data synchronization unit calculates a time lag between the supplied voltage data and the received voltage data on the basis of the reference points and synchronizes the supplied voltage data and the received voltage data on the basis of the time lag.

* * * * *